(12) United States Patent
Chung et al.

(10) Patent No.: US 7,368,869 B2
(45) Date of Patent: May 6, 2008

(54) LIGHT EMITTING DEVICE, DISPLAY APPARATUS HAVING THE LIGHT EMITTING DEVICE, AND METHOD OF MANUFACTURING THE DISPLAY APPARATUS

(75) Inventors: Jae-Hoon Chung, Suwon-si (KR); Hoon Kim, Suwon-si (KR); Joon-Hoo Choi, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 486 days.

(21) Appl. No.: 11/000,362

(22) Filed: Nov. 30, 2004

(65) Prior Publication Data

US 2005/0116638 A1 Jun. 2, 2005

(30) Foreign Application Priority Data

Dec. 1, 2003 (KR) .................... 10-2003-0086314

(51) Int. Cl.
*H05B 33/00* (2006.01)
(52) U.S. Cl. .................... 313/512; 313/504; 313/506; 445/43; 445/44; 445/25
(58) Field of Classification Search ............. 313/512, 313/506, 504
See application file for complete search history.

(56) References Cited

U.S. PATENT DOCUMENTS

| | | | | |
|---|---|---|---|---|
| 6,551,724 B2* | 4/2003 | Ishii et al. | ................. | 428/690 |
| 6,803,127 B2* | 10/2004 | Su et al. | ................... | 428/690 |
| 6,878,467 B2* | 4/2005 | Chung et al. | ............... | 428/690 |
| 7,005,199 B2* | 2/2006 | Kim et al. | ................. | 428/690 |
| 7,109,653 B2* | 9/2006 | Imamura | ................... | 313/512 |
| 2003/0170496 A1* | 9/2003 | Hieda et al. | ............... | 428/690 |
| 2006/0006798 A1* | 1/2006 | Buckley | ................... | 313/512 |

* cited by examiner

*Primary Examiner*—Ashok Patel
(74) *Attorney, Agent, or Firm*—F.Chau & Associates, LLC

(57) ABSTRACT

A light emitting device includes a light emitting member formed on a substrate, a first blocking layer formed on the light emitting member and an absorbing layer interposed between the light emitting member or the first blocking layer. The first blocking layer prevents oxygen or moisture in air from permeating into the light emitting member generating light. The absorbing layer absorbs the oxygen or the moisture that passes through the first blocking layer. The light emitting device may have reduced volume and improved lifetime.

34 Claims, 11 Drawing Sheets

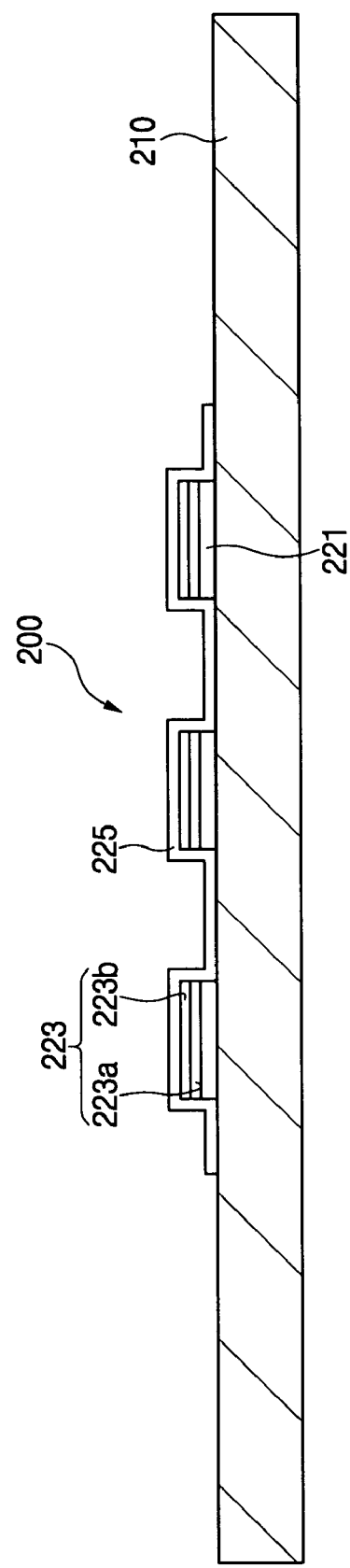

LIGHT EMITTING DEVICE, DISPLAY APPARATUS HAVING THE LIGHT EMITTING DEVICE, AND METHOD OF MANUFACTURING THE DISPLAY APPARATUS

CROSS REFERENCE TO RELATED APPLICATION

This application claims priority under 35 USC § 119 to Korean Patent Application No. 2003-86314, filed on Dec. 1, 2003, the contents of which are incorporated herein by reference in its entirety.

BACKGROUND OF THE INVENTION

1. Field of the Invention

The present invention relates to a light emitting device, a display apparatus having the light emitting device, and a method of manufacturing the display apparatus. More particularly, the present invention relates to a light emitting device having a reduced volume and an improved durability, a display apparatus including the light emitting device, and a method of manufacturing the display apparatus.

2. Description of the Related Art

Recently, information processing apparatuses becomes more important and the information processing apparatuses are widely used in various fields of several industries. However, because processed data by the information processing apparatus are generally represented as electric signals or codes, users may not directly identify the processed data with naked eyes. Thus, a display apparatus serving as an interface is required for user to identify the processed data by the information processing apparatus.

The display apparatuses are generally classified into emissive display apparatuses and non-emissive display apparatuses. The emissive display apparatus typically includes a cathode ray tube (CRT), a plasma display panel (PDP), a light emitting diode (LED), an electro-luminescence display (ELD) device, etc. The non-emissive display apparatus typically includes a liquid crystal display (LCD) device, an electrochemical display (ECD), an electro-phoretic image display (EPID), etc.

In the emissive display apparatus, the ELD devices become important. The ELD devices are typically divided into inorganic electro-luminescence display devices and organic electro-luminescence display devices according as electro-luminescence materials thereof.

The organic electro-luminescence display device has an anode electrode and a cathode electrode, and an organic light emitting layer. The organic light emitting layer has characteristics deteriorated by oxygen or moisture permeated into the organic light emitting layer because the organic light emitting layer is composed of organic material. When the organic light emitting layer contacts with oxygen or moisture in air, the lifetime of the organic light emitting layer may be rapidly reduced.

Table I shows the luminescence of the light generated from a conventional organic electro-luminescence display device. In Table 1, the organic electro-luminescence display device is exposed to an inferior environment in which the content of moisture is about 80%, temperature is about 80° C. and applied current is about 20 mA/cm². The lifetime of the organic electro-luminescence display device corresponds to the time when the luminance of the light generated from the organic electro-luminescence display device becomes a half of an initial luminance thereof.

| time (hour) | luminescence (%) |
|---|---|
| 0 | 100 |
| 5 | 81 |
| 10 | 75.5 |
| 15 | 71 |
| 20 | 67 |
| 25 | 64 |
| 30 | 60 |
| 35 | 57 |
| 40 | 53 |
| 43.6 | 50 |

As shown in Table 1, the luminance of the light generated from the organic electro-luminescence display device rapidly decreases in proportion as time elapses. After about 43 hours, the luminance of the light generated from the organic electro-luminescence display device decreases to half of an initial luminance thereof. That is, the organic electro-luminescence display device may have a lifetime of about 43 hours when the organic electro-luminescence display device rapidly makes contact with moisture or oxygen in air.

Considering this problem, there is provides an organic electro-luminescence display device including a metal cap that prevents moisture or oxygen from directly contacting the organic electro-luminescence display device. However, moisture or oxygen may gradually permeate into the organic electro-luminescence display device through a gap between the metal cap and the organic electro-luminescence display device when the organic electro-luminescence display device is covered with the metal cap. Therefore, the electrical characteristics and lifetime of the organic electro-luminescence display device may be gradually deteriorated by the permeated oxygen or moisture. Further, the organic electro-luminescence display device may have increased volume and weigh when the organic electro-luminescence display device has the metal cap.

SUMMARY OF THE INVENTION

The present invention provides a light emitting device having a reduced volume that prevents deterioration of the light emitting layer by blocking permeation of oxygen or moisture.

The present invention also provides a display apparatus having enhanced lifetime by employing the light emitting device.

The present invention also provides a method of manufacturing a display apparatus having enhanced lifetime by employing the light emitting device.

In accordance with one exemplary embodiment of the present invention, a light emitting device includes a substrate, a light emitting member, at least one first blocking layer and at least one absorbing layer. The light emitting member is disposed on the substrate to generate a light. The first blocking layer is formed on the light emitting member to prevent an oxygen or a moisture from permeating into the first blocking layer. The absorbing layer is formed between the light emitting member and the first blocking layer to absorb a portion of the oxygen or the moisture that passes through the first blocking layer. The light emitting member includes a first electrode, a second electrodes corresponding to the first electrode, and an organic light emitting layer formed between the first electrode and the second electrode. The second electrode may include transparent conductive material or non-transparent conductive material, and also the first electrode may include non-transparent conductive material or transparent conductive material. The first blocking layer may include silicon oxide, silicon nitride, magnesium oxide, aluminum oxide, aluminum nitride, titanium oxide, polyacetylen group, polyimide group, etc. The absorbing layer may include calcium oxide, barium oxide, magnesium oxide, aluminum oxide, etc. The light emitting device may include a reinforcing member formed on the first blocking layer and/or a second blocking layer formed between the absorbing layer and the light emitting member. The second blocking layer may include silicon oxide, silicon nitride, magnesium oxide, aluminum oxide, aluminum nitride, titanium oxide, polyacetylen group, polyimide group, etc. Here, the absorbing layer may include calcium, barium, magnesium, aluminum, etc. Additionally, the light emitting device may further include a plurality of the first blocking layers and the absorbing layers are alternately disposed on the light emitting member.

In accordance with another exemplary embodiment of the present invention, a display apparatus for displaying an image includes a substrate, a display member, a first blocking layer and an absorbing layer. The display member is disposed on the substrate to generate a red light, a green light and a blue light for displaying the image. The first blocking layer is formed on the light emitting member to prevent oxygen or moisture from permeating into the first blocking layer. The absorbing layer is interposed between the light emitting member and the first blocking layer to absorb a portion of the oxygen or the moisture that passes through the first blocking layer.

In accordance with still another exemplary embodiment of the present invention, a display apparatus is manufactured as follows. In the method, a display member for generating a light is formed on a substrate. An absorbing layer is formed on the display member to absorb a portion of the oxygen or the moisture that is permeated into the absorbing layer. A first blocking layer is formed between the display member and the absorbing layer to prevent the oxygen or the moisture from permeating into the first blocking layer. A second blocking layer may be formed between the display member and the absorbing layer.

According to the present invention, a light emitting device includes at least one first blocking layer and/or at least one absorbing layer. The first blocking layer prevents oxygen or moisture in air from permeating into a light emitting member. The absorbing layer absorbs the oxygen or the moisture that is permeated therethrough. In addition, the absorbing layer may form oxide or hydrate therein. Therefore, the blocking layer and absorbing layer effectively prevent together the permeation of oxygen and/or moisture into the light emitting member. In addition, a display apparatus having the light emitting device may have improved lifetime and reliability by preventing the permeation of oxygen and/or moisture.

BRIEF DESCRIPTION OF THE DRAWINGS

The above and other features and advantages of the present invention will become readily apparent by reference to the following detailed description when considered in conjunction with the accompanying drawings wherein:

FIGS. 7A through 7D are cross sectional views illustrating a method of manufacturing a display apparatus according to one exemplary embodiment of the present invention.

DESCRIPTION OF THE PREFERRED EMBODIMENTS

Figure 1:
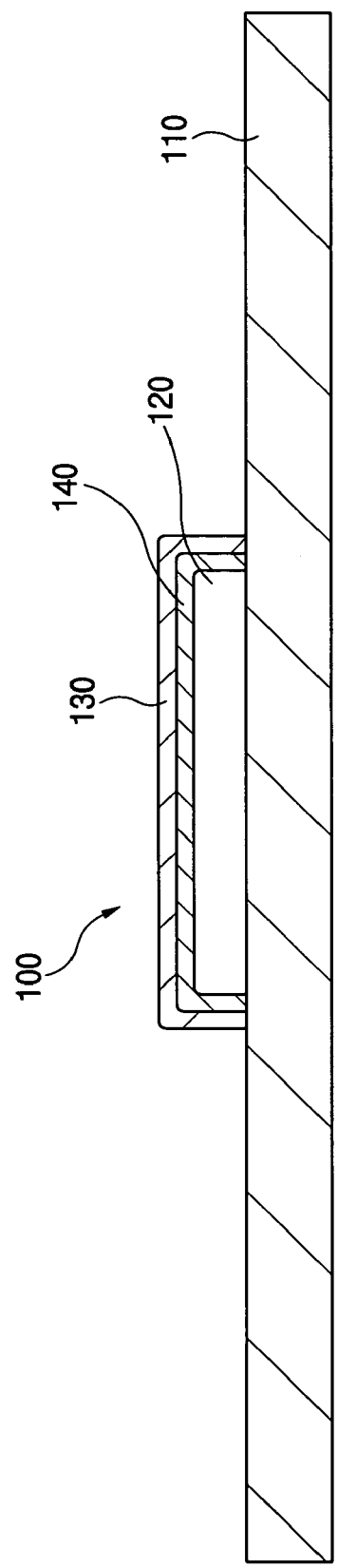
FIG. 1 is a cross sectional view illustrating a light emitting device in accordance with one embodiment of the present invention.

The present invention now will be described more fully hereinafter with reference to the accompanying drawings, in which embodiments of the invention are shown. The present invention may, however, be embodied in many different forms and should not be construed as limited to the embodiments set forth herein; rather, these embodiments are provided so that this disclosure will be through and complete, and will fully convey the scope of the invention to those skilled in the art. In the drawings, the thickness of layers and regions are exaggerated for clarity. Like reference numerals refer to similar or identical elements throughout. It will be understood that when an element such as a layer, region or substrate is referred to as being "on" or "onto" another element, it can be directly on the other element or intervening elements may also be present.

Light Emitting Device

Figure 2:
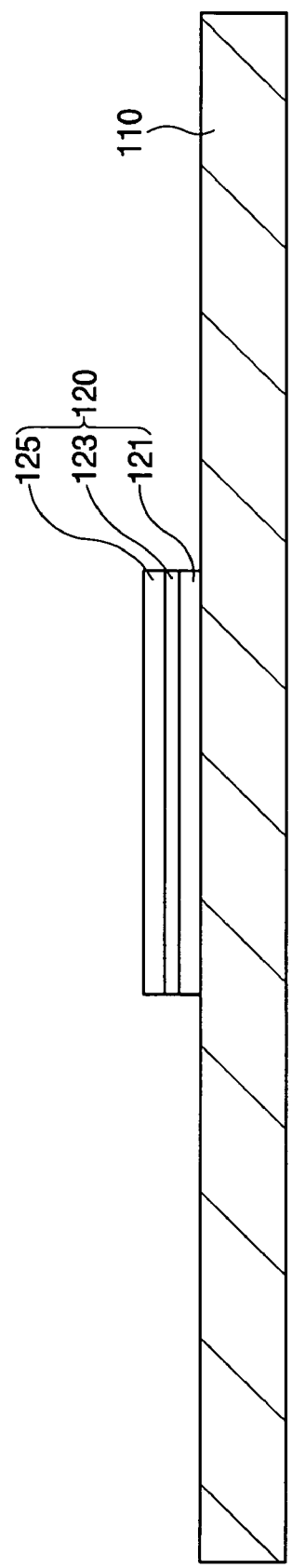
FIG. 2 is a cross sectional view illustrating the light emitting member in FIG. 1.

FIG. 1 is a cross sectional view illustrating a light emitting device in accordance with one embodiment of the present invention and FIG. 2 is a cross sectional view illustrating a light emitting member in FIG. 1.

Referring to FIG. 1, a light emitting device 100 includes a substrate 110, a light emitting member 120, an absorbing layer 140, and a first blocking layer 130.

The substrate 110 may include a transparent plate. For example, the substrate 110 includes a transparent glass substrate or flexible substrate for example polycarbonate, polyestersulfonate. Alternatively, the substrate 110 may include a non-transparent substrate. For example, the non-transparent substrate includes a metal substrate.

Referring to FIGS. 1 and 2, the light emitting member 120 for generating a light is formed on the substrate 110. The light emitting member 120 includes a first electrode 121 directly formed on the substrate 110, an organic light emitting layer 123 disposed on the first electrode 121, and a second electrode 125 positioned on the organic light emitting layer 123.

The first electrode 121 corresponds to an anode electrode that provides holes whereas the second electrode 125 corresponds to a cathode electrode that provides electrons.

The organic light emitting layer 123 is interposed between the first and second electrodes 121 and 125. When an electron and a hole are injected into the organic light emitting layer 123, respectively, an exciton is generated by coupling the electron to the hole. The organic light emitting layer 123 generates the light when the exciton changes from an excitation state to a ground state.

The first electrodes 121 may be formed using a transparent conductive material such as indium tin oxide (ITO) or indium zinc oxide (IZO). The second electrode 125 may be formed using metal such as calcium, barium, magnesium, aluminum (Al) or alloys thereof. Alternatively, the first electrode 121 may be formed using metal, whereas the second electrode 125 may be formed using transparent conductive material.

The organic light emitting layer 123 may be deteriorated by oxygen or moisture permeated into the organic light emitting layer 123 to thereby greatly reduce the luminescence of the light generated from the organic light emitting layer 123.

To prevent the characteristics of the organic light emitting layer 123 from deteriorating, the first blocking layer 130 is provided in the light emitting device 120. That is, the first blocking layer 130 prevents the deterioration of the light emitting device 120 by blocking oxygen or moisture that passes through the first blocking layer 130. The first blocking layer 130 may be formed using transparent inorganic material or transparent inorganic compounds such as glass or transparent aluminum oxide. Alternatively, the first blocking layer 130 may be formed using transparent organic material that does not react with oxygen or moisture. Preferably, the first blocking layer 130 controls a transmission index of the light generated from the light emitting device 120 by about 40 to about 100 percent. Particularly, the first blocking layer 130 including transparent inorganic material or inorganic compounds may more effectively prevent the deterioration of the organic light emitting layer 123 by efficiently blocking oxygen or moisture in comparison with the first blocking layer 130 includes transparent organic material or transparent organic compounds.

However, the first blocking layer 130 including transparent inorganic material or inorganic compounds may have a disadvantage that relatively high manufacturing cost comparing to the first blocking layer 130 including transparent organic material or organic compounds. Thus, the first blocking layer 130 includes organic material or inorganic material as occasion demands.

In one embodiment of the present invention, the first blocking layer 130 may be formed using inorganic material such as silicon oxide film (SiO), silicon nitride film (SiN), magnesium oxide film (MgO), aluminum oxide film (AlO), aluminum nitride film (AlN) or titanium oxide film (TiO). When the first blocking layer 130 includes these inorganic materials, the first blocking layer 130 may efficiently prevent permeation of oxygen or moisture because the first blocking layer 130 has a relatively dense structure.

In another embodiment of the present invention, the first blocking layer 130 may be formed using organic material such as polyacetylen group or polyimide group.

The first blocking layer 130 may have a thickness of about 100 to about 100,000 Å so as to protect the light emitting member 120 by sufficiently blocking oxygen or moisture. For example, the first blocking layer 130 has an amount of permeability of oxygen or moisture by about 1 to about 60 g/m$^2$ day.

The absorbing layer 140 is formed between the first blocking layer 130 and the light emitting member 120. The absorbing layer 140 reacts with oxygen that passes therethrough so that oxide is formed in the absorbing layer 140 in accordance with reaction between oxygen and the ingredients contained in the absorbing layer 140. Additionally, the absorbing layer 140 reacts with moisture passing therethrough so that hydrate is formed in the absorbing layer 140 in accordance with reaction between hydrate and the ingredients contained in the absorbing layer 140. Alternatively, the absorbing layer 140 may physically absorb the oxygen or the moisture.

To prevent permeation of oxygen or moisture, the absorbing layer 140 includes a thin film formed using material that sufficiently reacts with oxygen or moisture. For example, the absorbing layer 140 includes calcium oxide (CaO), barium oxide (BaO), magnesium oxide (MgO), aluminum oxide ($Al_2O_3$), etc.

When the absorbing layer 140 directly makes contact with the light emitting member 120, the absorbing layer 140 may include metal oxide such as calcium oxide, barium oxide, magnesium oxide or aluminum oxide. The absorbing layer 140 may have a thickness of about 10 to about 10,000 Å to properly adjust the transmittance index by about 40 to about 90 percent. When the absorbing layer 140 has thin thickness, the light generated from the light emitting member 120 may easily pass through the absorbing layer 140.

In one embodiment of the present invention, the light emitting member 120 may include a non-transparent first electrode, an organic light emitting layer and a transparent second electrode, which are sequentially formed on the substrate 110. Alternatively, the light emitting member 120 may include a non-transparent first electrode, an organic light emitting layer and a transparent second electrode, which are successively on the substrate 110.

Figure 3:
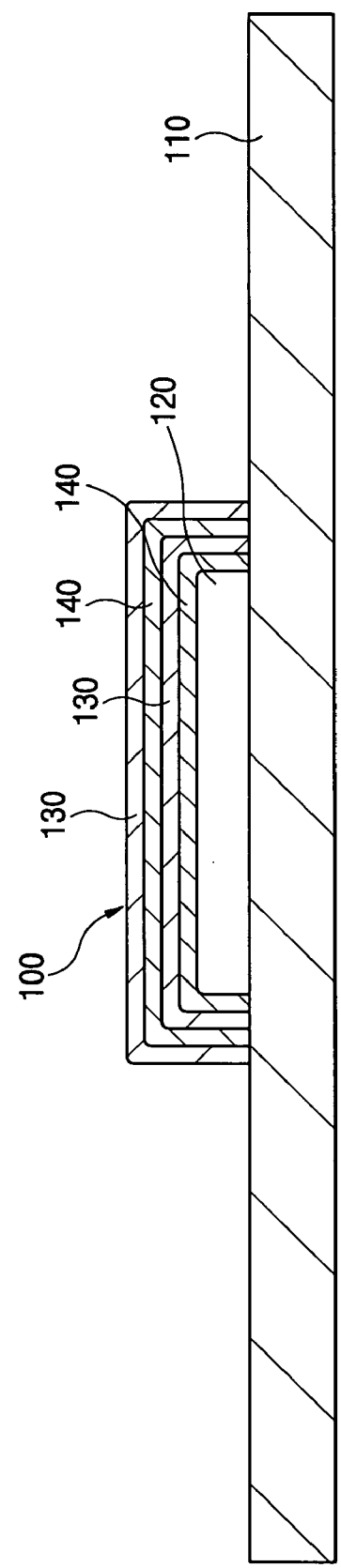
FIG. 3 is a cross sectional view illustrating the light emitting device in accordance with another embodiment of the present invention.

FIG. 3 is a cross sectional view illustrating a light emitting device in accordance with another embodiment of the present invention.

Referring to FIG. 3, the light emitting device includes absorbing layers 140 and first blocking layers 130 alternately disposed on a light emitting member 120 to thereby protect the light emitting member 120 by blocking oxygen or moisture that permeates into the light emitting member 120. The alternately formed absorbing layers 140 and first blocking layers 130 more efficiently prevent block oxygen or moisture from passing therethrough in comparison with one absorbing layer and one first blocking layer. Thus, the light emitting member 120 may be effectively protected form oxygen or moisture.

When the absorbing layer 140 and the first blocking layer 130 are formed on the light emitting member 120, the absorbing layer 140, the first blocking layer 130 and/or the light emitting member 120 may be damaged by impact, vibration, scratch etc.

Figure 4:
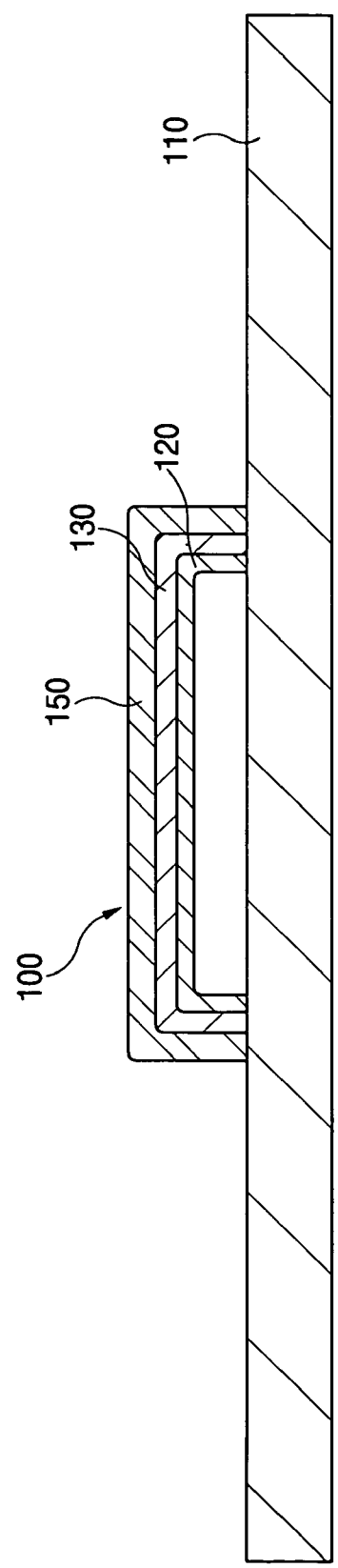
FIG. 4 is a cross sectional view illustrating a reinforcing member formed on a first blocking layer in FIG. 1.

FIG. 4 is a cross sectional view illustrating a reinforcing member formed on the first blocking layer in FIG. 1.

Referring to FIG. 4, a reinforcing member 150 having high mechanical strength is formed on the first blocking layer 130. The reinforcing member 150 may include plastic resin or glass. The reinforcing member 150 additionally prevents oxygen or moisture from permeating into the first blocking layer 130.

As described above, at least one absorbing layer 140 and at least one first blocking layer 130 are formed on the light emitting member 120. The absorbing layer 140 reacts with moisture or oxygen in air to form oxide or hydrate so that oxygen or moisture may not permeate into the light emitting member 120. Additionally, the first blocking layer 130 blocks permeation of the moisture or oxygen, thereby effectively prevent the deterioration of the light emitting member 120. Thus, the light emitting member 120 may have improved characteristics.

Figure 5:
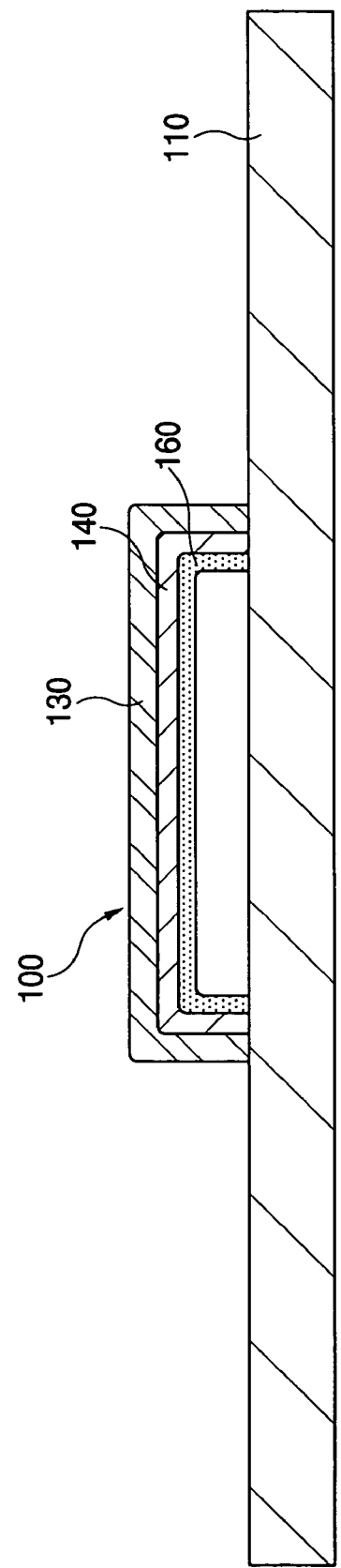
FIG. 5 is a cross sectional view illustrating a light emitting member in accordance with still another embodiment of the present invention.

FIG. 5 is a cross sectional view illustrating a light emitting device in accordance with still another embodiment of the present invention. In the present embodiment, the light emitting device has a construction substantially identical to that of the light emitting device in FIG. 1 except a second blocking layer 160.

Referring to FIG. 5, the light emitting device includes the second blocking layer 160 interposed between a light emitting member 120 and an absorbing layer 140. The second blocking layer 160 may be formed using silicon oxide, silicon nitride, magnesium oxide, aluminum oxide, titanium oxide, etc. Alternatively, the second blocking layer 160 may be formed using polyacetylen group or polyimide group. That is, the second blocking layer 160 may be formed using material substantially identical to that of a first blocking layer 130.

Since the second blocking layer 160 is formed on the light emitting member 120, the absorbing layer 140 is disposed between a first blocking layer 130 and the second blocking layer 160.

When the absorbing layer 140 is formed between the first and second blocking layers 130 and 160, the absorbing layer 140 may include calcium (Ca), barium (Ba), magnesium (Mg), aluminum (Al), oxides thereof, etc. In case that the absorbing layer 140 includes calcium, barium, magnesium or aluminum, the absorbing layer 140 may efficiently react with oxygen or moisture. Thus, oxygen or moisture may hardly pass through the absorbing layer 140 so that the deterioration of the light emitting member 120 may be effectively prevented.

Table 2 shows the luminance variation of the light generated from the light emitting member 120 relative to time. In Table 2, the light emitting member 120 is exposed to an inferior environment in which the content of moisture is about 80%, temperature is about 80° C. and applied current is about 20 mA/cm$^2$. Here, the light emitting member 120 is protected by the first blocking layer 130, the absorbing layer 140 and the second blocking layer 160.

TABLE 2

| time (hour) | luminance (%) |
|---|---|
| 0 | 100% |
| 100 | 67.7% |
| 200 | 61.0% |
| 300 | 57.0% |
| 400 | 54.0% |
| 500 | 52.0% |
| 590 | 50.0% |

As shown in Table 2, the luminance of the light generated from the light emitting member 120 decreases slowly in proportion as time elapses. After about 500 hours to 600 hours, the luminance of the light generated from the light emitting member 120 decreases to half of an initial luminance thereof. Comparing to the lifetime of a conventional light emitting member in Table 1, the lifetime of the light emitting member 120 increases by more than several tens of times.

As described above, the first blocking layer 130, the absorbing layer 140 and the second blocking layer 160 are successively formed on the light emitting member 120 to thereby prevent decrease of the lifetime of the light emitting member 120.

Display Apparatus

Figure 6:
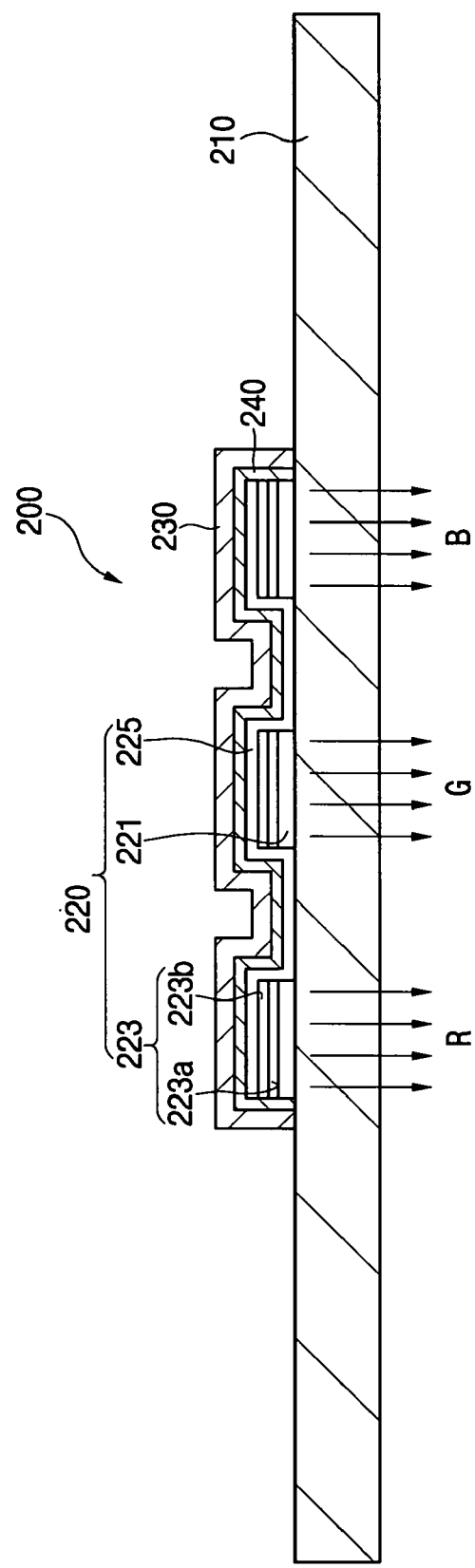
FIG. 6 is a cross sectional view illustrating a display apparatus in accordance with one embodiment of the present invention.

FIG. 6 is a cross sectional view illustrating a display apparatus in accordance with one embodiment of the present invention.

Referring to FIG. 6, a display apparatus 200 includes a substrate 210, a display member 220, a first blocking layer 230 and an absorbing layer 240.

The substrate 210 may include a transparent plate or an opaque plate. The substrate 210, for example, includes a transparent glass plate.

The display member 220 includes first electrodes 222, an organic light emitting layer 223, and a second electrode 225. The first electrodes 222 are disposed on the substrate 210 in a matrix configuration. The organic light emitting layer 223 is positioned on the first electrodes 221 and the second electrode 225 is formed on the organic light emitting layer 223.

In one embodiment of the present invention, each of the first electrodes 221 corresponds to an anode electrode that provides holes to the organic light emitting layer 223. The first electrode 221 may include transparent conductive material such as an indium tin oxide (ITO), an indium zinc oxide (IZO) or an amorphous indium tin oxide (a-ITO), etc.

The second electrode 225 corresponds to a cathode electrode that provides electrons to the organic light emitting layer 223. The second electrode 225 may include non-transparent conductive material such as aluminum or aluminum alloy.

The organic light emitting layer 223 positioned between the first electrodes 221 and the second electrode 225 generates a light using a bonding energy caused by combination of the holes and the electrons. The organic light emitting layer 223 may include a hole injection layer 223a and a light emitting layer 223b. The light emitting layer 223b may include a red light emitting layer for generating a red light, a green light emitting layer for generating a green light, and a blue light emitting layer for generating a blue light.

In one embodiment of the present invention, the second electrode 225 including aluminum or aluminum alloy may be disposed on the substrate 210, the organic light emitting layer 223 may be formed on the second electrode 225. Here, the first electrodes 221 including ITO, IZO or a-ITO may be disposed on the organic light emitting layer 223.

The first blocking layer 230 encompasses the display member 220 to prevent oxygen or moisture from permeating into the display member 220. Thus, the first blocking layer 230 may prevent deterioration of the display member 220 by blocking oxygen or moisture that passes therethrough. Additionally, the first blocking layer 230 may enhances the brightness of the light generated from the organic light emitting layer 223.

The first blocking layer 230 may include a transparent inorganic material or a transparent organic material that does react with oxygen or moisture. The light transmittance index of the first blocking layer 230 may be in a range of about 40 to about 100 percent.

When the first blocking layer 230 includes transparent inorganic material, the first blocking layer 230 may advantageously prevent oxygen or moisture from permeating into the display member 220. If the first blocking layer 230 includes transparent organic material, the first blocking layer 230 may somewhat block oxygen or moisture from permeating into the display member 220. However, the manufacturing cost of the first blocking layer 230 may be greatly reduced when the first blocking layer 230 is formed using transparent organic material comparing to transparent inorganic material.

The first blocking layer 230 may be formed using inorganic material such as metal oxide. For example, the first blocking layer 230 includes silicon oxide, silicon nitride, magnesium oxide, aluminum oxide, aluminum nitride, titanium oxide, etc. These metal oxides have dense structures so that the first blocking layer 230 may effectively prevent oxygen or moisture from permeating into the light emitting member 220. Alternatively, the first blocking layer 230 may include organic material such as polyacetylen group or polyimide group.

The first blocking layer 230 may have a thickness of about 100 Å to about 100 μm to sufficiently prevent the permeation of oxygen or moisture into the light emitting member 220. Here, the first blocking layer 230 may have the amount of permeability of oxygen or moisture in a range of about 1 to about 60 g/m²day.

The absorbing layer 240 is formed between the first blocking layer 230 and the light emitting member 220. The ingredients contained in the absorbing layer 240 react with oxygen or moisture that passes therethrough, thereby forming oxide or hydrate therein. Therefore, the permeation of oxygen or moisture may be efficiently prevented. For example, the absorbing layer 240 includes metal oxide such as calcium oxide (CaO), barium oxide (BaO), magnesium oxide (MgO), aluminum oxide ($Al_2O_3$), etc. Alternatively, the absorbing layer 240 may include highly reactive metal such as calcium (Ca), barium (Ba), magnesium (Mg), aluminum (Al), etc.

In particular, when the absorbing layer 240 may directly contact the light emitting member 220, the absorbing layer 240 includes metal oxide such as calcium oxide, barium oxide, magnesium oxide, aluminum oxide, etc. However, when the absorbing layer 240 including highly reactive metal may directly contact the light emitting member 220, the light emitting member 220 may be corroded or damaged.

The absorbing layer 240 may has a thickness of about 10 to about 10,000 Å to control a light transmittance index thereof by about 40 to about 90 percent. When the absorbing layer 240 has thin thickness, the light generated from the light emitting member 220 may easily pass through the absorbing layer 240. Therefore, the light emitting member 220 may include a transparent first electrode, an organic light emitting layer and a non-transparent second electrode formed on the substrate 210 in serial. Alternatively, the light emitting member 220 may include a non-transparent first electrode, an organic light emitting layer and a transparent second electrode sequentially formed on the substrate 210.

Method of Manufacturing Display Apparatus

FIGS. 7A through 7D are cross sectional views illustrating a method of manufacturing a display apparatus according to one exemplary embodiment of the present invention.

Figure 7A:
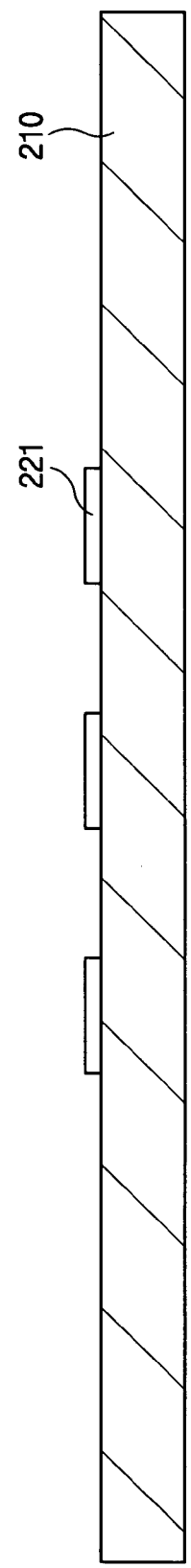

Referring to FIG. 7A, a first electrode 221 is formed on a substrate 210 in a matrix shape. In a process for forming the first electrode 221, a transparent conductive film is formed on the substrate 210 using indium tin oxide (ITO) or indium zinc oxide (IZO). The, the transparent conductive film is patterned in the matrix shape by a photolithography process to thereby form the first electrode 221 on the substrate 210.

Referring to FIG. 7B, an organic light emitting layer 223 having a hole injection layer 223a and a light emitting layer 223b is formed on the first electrode 221. In one embodiment of the present invention, after the hole injection layer 223a is be formed on the first electrode 221, the light emitting layer 223b is formed on the hole injection layer 223a.

A second electrode 225 is formed to cover the light emitting layer 223b. The second electrode 225 may be formed using aluminum or aluminum alloy by a sputtering process or a evaporation process.

Figure 7C:
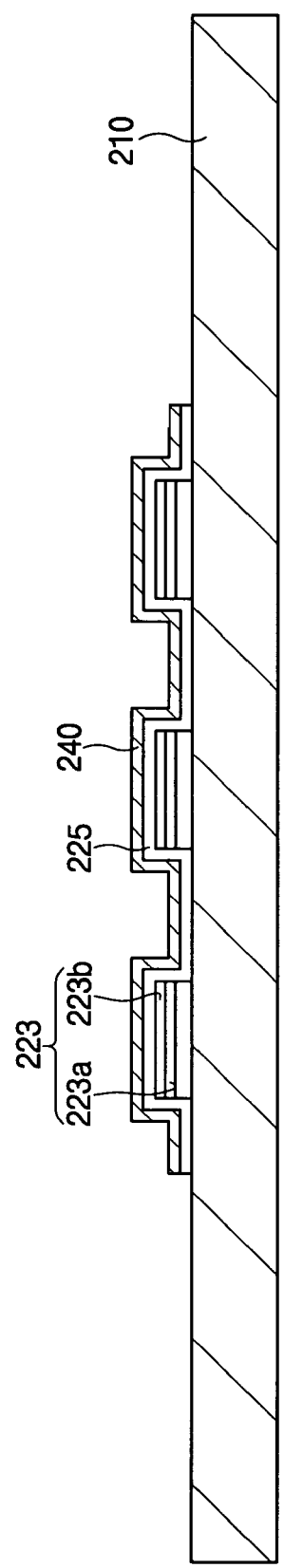

Referring to FIG. 7C, an absorbing layer 240 is formed on the second electrode 225. The absorbing layer 240 may be formed using metal oxide such as calcium oxide, barium oxide, manganese oxide, aluminum oxide, etc. The absorbing layer 240 may have a thickness of about 10 Å to about 1 μm measured from the upper face of the second electrode 225 so that the absorbing layer 240 has the transmittance index of the light passing therethrough by about 40% to about 90%. Oxygen or moisture in air change into oxide or hydrate by reacting with the ingredients contained in the absorbing layer 240. Hence, the absorbing layer 240 prevents the display member 220 from being deteriorated due to oxygen or moisture.

Figure 7D:
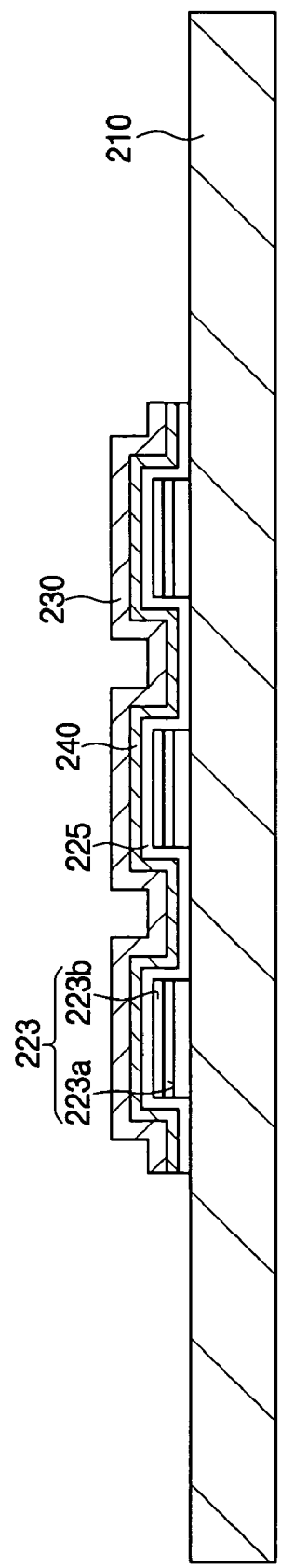

Referring to FIG. 7D, a first blocking layer 230 is formed on the absorbing layer 240. The first blocking layer 230 may include inorganic material such as silicon oxide, silicon nitride, magnesium oxide, aluminum oxide, aluminum nitride, titanium oxide, etc. Alternatively, the first blocking layer 230 may include organic material such as polyacetylen group, polyimide group, etc. The first blocking layer 230 blocks the permeation of oxygen or moisture.

In one embodiment of the present invention, a plurality of the first blocking layers 230 and a plurality of the absorbing layers 240 may be alternately formed so as to completely prevent oxygen or moisture from permeating thereto.

Figure 8:
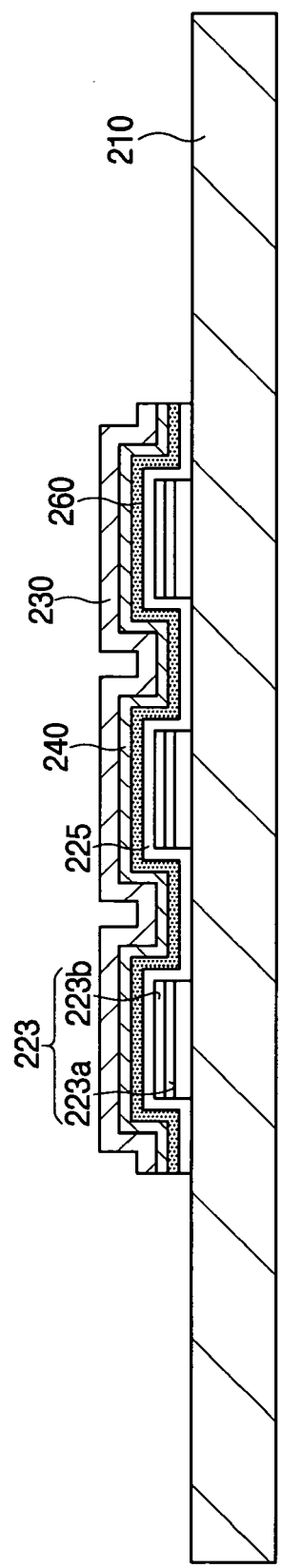
FIG. 8 is a cross sectional view illustrating a method of manufacturing a display apparatus according to another exemplary embodiment of the present invention.

FIG. 8 is a cross sectional view illustrating a method of manufacturing a display apparatus according to another exemplary embodiment of the present invention. In the present embodiment, the method of manufacturing a display apparatus substantially identical to the method described with reference to FIGS. 7A to 7D except a step for forming a second blocking layer 230.

Referring to FIG. 8, after forming a second electrode 225 over a substrate 210, a first blocking layer 260 is formed on the substrate 210 to cover the second electrode 225. The first blocking layer 260 may include inorganic material such as silicon oxide, silicon nitride, magnesium oxide, aluminum oxide, aluminum nitride, titanium oxide, etc. Alternatively, the first blocking layer 260 may include organic material such as polyacetylen group or polyimide group. The first blocking layer 260 blocks the permeation of oxygen or moisture from outside.

An absorbing layer 240 is formed to cover the first blocking layer 260. The absorbing layer 240 may include reactive metal such as calcium, barium, magnesium, aluminum, etc. Hence, the absorbing layer 240 may easily react with oxygen or moisture. As a result, oxygen or moisture may not reach to a display member 220 through the absorbing layer 260 so that the electric characteristics of the display member 220 are improved. The absorbing layer 240 may have a thickness of about 10 to about 10,000 Å to precisely control a light transmittance index thereof by about 40 to about 90 percent.

The second blocking layer 230 is formed on the absorbing layer 240. The second blocking layer 230 may include inorganic material such as silicon oxide, silicon nitride, magnesium oxide, aluminum oxide, aluminum nitride, titanium oxide, etc. Alternatively, the second blocking layer 230 may include organic material such as polyacetylen group, polyimide group, etc. That is, the second blocking layer 230 is formed using material substantially identical to or different from that of the first blocking layer 260. The second blocking layer 230 additionally blocks the permeation of oxygen or moisture thereto. Therefore, the first and second blocking layers 260 and 230 and the absorbing layer 240 may more effectively prevent oxygen or moisture from permeating into the display member 220.

According to the present invention, a light emitting device includes at least one first blocking layer and/or at least one absorbing layer. The first blocking layer prevents oxygen or moisture in air from permeating into a light emitting member. The absorbing layer reacts with oxygen or moisture permeated thereto so that the absorbing layer absorbs the oxygen or the moisture. In addition, the absorbing layer may form oxide or hydrate therein. Therefore, the blocking layer and absorbing layer effectively prevent together the permeation of oxygen and/or moisture into the light emitting member. In addition, a display apparatus having the light emitting device may have improved lifetime and reduced volume.

Having thus described exemplary embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A light emitting device comprising:
   a substrate;
   a light emitting member disposed on the substrate to generate a light;
   at least one first blocking layer formed on the light emitting member to prevent an oxygen or a moisture from permeating into the first blocking layer; and
   at least one absorbing layer formed between the light emitting member and the first blocking layer to absorb a portion of the oxygen or the moisture that passes through the first blocking layer,
   wherein the at least one absorbing layer includes different material from the at least one first blocking layer.

2. The light emitting device of claim 1, wherein the absorbing layer forms an oxide or a hydrate by reacting with a portion of the oxygen or the moisture that passes through the first blocking layer.

3. The light emitting device of claim 1, wherein the light emitting member comprises a first electrode, a second electrodes corresponding to the first electrode, and an organic light emitting layer formed between the first electrode and the second electrode.

4. The light emitting device of claim 3, wherein the second electrode comprises a transparent conductive material and the first electrode comprises a non-transparent material.

5. The light emitting device of claim 3, wherein the second electrode comprises a non-transparent conductive material and the first electrode comprises a transparent conductive material.

6. The light emitting device of claim 1, wherein the first blocking layer comprises at least one of silicon oxide, silicon nitride, magnesium oxide, aluminum oxide, aluminum nitride, titanium oxide, or combinations thereof.

7. The light emitting device of claim 1, wherein the first blocking layer comprises at least one of polyacetylen group, polyimide group or combinations thereof.

8. The light emitting device of claim 1, wherein the first blocking layer has a thickness of about 100 to about 100,000 Å and has an amount of a permeability of the oxygen or the moisture by about 1 to about 60 g/m$^2$ day.

9. The light emitting device of claim 1, wherein a light transmittance index of the first blocking layer is in a range of about 40 to about 100 percent.

10. The light emitting device of claim 1, wherein the absorbing layer comprises at least one calcium oxide, barium oxide, magnesium oxide, aluminum oxide or combinations thereof.

11. The light emitting device of claim 1, wherein the absorbing layer has a thickness of about 1 to about 10 μm to adjust a light transmittance index thereof by about 40 to about 90 percent.

12. The light emitting device of claim 1, further comprising a reinforcing member formed on the first blocking layer.

13. The light emitting device of claim 1, wherein a plurality of the first blocking layers and the absorbing layers are alternately disposed on the light emitting member.

14. The light emitting device of claim 1, further comprising a second blocking layer formed between the absorbing layer and the light emitting member.

15. The light emitting device of claim 14, wherein the second blocking layer comprises at least one of silicon oxide, silicon nitride, magnesium oxide, aluminum oxide, aluminum nitride, titanium oxide or combinations thereof.

16. The light emitting device of claim 14, wherein the second blocking layer comprises at least one selected from the group consisting of polyacetylen group, polyimide group or combinations thereof.

17. The light emitting device of claim 14, wherein the absorbing layer comprises at least one of calcium, barium, magnesium, aluminum, calcium oxide, barium oxide, magnesium oxide, aluminum oxide, or combinations thereof.

18. A display apparatus for displaying an image comprising:
   a substrate;
   a display member disposed on the substrate to generate a red light, a green light and a blue light for displaying the image;
   a first blocking layer formed on the light emitting member to prevent oxygen or moisture from permeating into the first blocking layer; and
   an absorbing layer interposed between the light emitting member and the first blocking layer to absorb a portion of the oxygen or the moisture that passes through the first blocking layer,
   wherein the absorbing layer includes different material from the first blocking layer.

19. The display apparatus of claim 18, wherein the absorbing layer forms an oxide or a hydrate by reacting with a portion of the oxygen or the moisture that passes through the first blocking layer.

20. A method of manufacturing a display apparatus comprising:
   forming a display member for generating a light on a substrate;
   forming an absorbing layer on the display member to absorb an oxygen or a moisture that is permeated into the absorbing layer; and
   forming a first blocking layer to prevent the oxygen or the moisture from permeating into the first blocking layer,
   wherein the absorbing layer includes different material from the first blocking layer.

21. The method of claim 20, wherein the absorbing layer is formed to form an oxide or a hydrate by reacting with the oxygen or the moisture.

22. The method of claim 20, wherein forming the display member comprises:
   forming a first electrode on the substrate using a transparent conductive material;
   forming an organic light emitting layer on the first electrode; and
   forming a second electrode on the organic light emitting layer using a non-transparent conductive material.

23. The method of claim 20, wherein forming the display member comprises:

forming a first electrode on the substrate using a nontransparent conductive material;

forming an organic light emitting layer on the first electrode; and forming a second electrode on the organic light emitting layer using a transparent conductive material.

24. The method of claim 20, wherein the absorbing layer is formed using at least one of calcium, barium, magnesium, aluminum, calcium oxide, barium oxide, magnesium oxide, aluminum oxide or combinations thereof.

25. The method of claim 20, wherein the first blocking layer is formed using at least one of silicon oxide, silicon nitride, magnesium oxide, aluminum oxide, aluminum nitride, titanium oxide or combinations thereof.

26. The method of claim 20, wherein the first blocking layer is formed using at least one of polyacetylen group, polyimide or combinations thereof group.

27. The method of claim 20, further comprising forming a second blocking layer between the display member and the absorbing layer.

28. The method of claim 27, wherein the second blocking layer is formed using any one selected from the group consisting of silicon oxide, silicon nitride, magnesium oxide, aluminum oxide, aluminum nitride and titanium oxide.

29. The method of claim 27, wherein the second blocking layer is formed using at least one of polyacetylen group, polyimide or combinations thereof.

30. The method of claim 27, wherein the absorbing layer is formed using at least one of calcium, barium, magnesium, aluminum, calcium oxide, barium oxide, magnesium oxide, aluminum oxide or combinations thereof.

31. A light emitting device comprising:

a substrate;

a light emitting member disposed on the substrate to generate a light;

at least one first blocking layer formed on the light emitting member to prevent an oxygen or a moisture from permeating into the first blocking layer;

at least one absorbing layer formed between the light emitting member and the first blocking layer to absorb a portion of the oxygen or the moisture that passes through the first blocking layer; and a reinforcing member formed on the first blocking layer.

32. A light emitting device comprising:

a substrate;

a light emitting member disposed on the substrate to generate a light;

at least one first blocking layer formed on the light emitting member to prevent an oxygen or a moisture from permeating into the first blocking layer; and at least one absorbing layer formed between the light emitting member and the first blocking layer to absorb a portion of the oxygen or the moisture that passes through the first blocking layer, wherein a plurality of the first blocking layers and the absorbing layers are alternately disposed on the light emitting member.

33. A light emitting device comprising:

a substrate;

a light emitting member disposed on the substrate to generate a light;

at least one first blocking layer formed on the light emitting member to prevent an oxygen or a moisture from permeating into the first blocking layer; and at least one absorbing layer formed between the light emitting member and the first blocking layer to absorb a portion of the oxygen or the moisture that passes through the first blocking layer; and a second blocking layer formed between the absorbing layer and the light emitting member.

34. A method of manufacturing a display apparatus comprising:

forming a display member for generating a light on a substrate;

forming an absorbing layer on the display member to absorb an oxygen or a moisture that is permeated into the absorbing layer;

forming a first blocking layer to prevent the oxygen or the moisture from permeating into the first blocking layer; and forming a second blocking layer between the display member and the absorbing layer.

* * * * *